United States Patent
Shi et al.

(10) Patent No.: US 8,373,257 B2
(45) Date of Patent: Feb. 12, 2013

(54) TOP EXPOSED CLIP WITH WINDOW ARRAY

(75) Inventors: Lei Shi, Shanghai (CN); Zhao Liang, Shanghai (CN); Kai Liu, Mountain View, CA (US)

(73) Assignee: Alpha & Omega Semiconductor Incorporated, Sunnyvale, CA (US)

( * ) Notice: Subject to any disclaimer, the term of this patent is extended or adjusted under 35 U.S.C. 154(b) by 718 days.

(21) Appl. No.: 12/237,593

(22) Filed: Sep. 25, 2008

(65) Prior Publication Data
US 2010/0072585 A1 Mar. 25, 2010

(51) Int. Cl.
*H01L 23/495* (2006.01)
(52) U.S. Cl. .......... 257/669; 257/E23.042; 257/E23.045
(58) Field of Classification Search .................. 257/669, 257/672, 675, E23.034, E23.042, E23.045, 257/E23.047, E23.048, 674
See application file for complete search history.

(56) References Cited

U.S. PATENT DOCUMENTS

| | | | |
|---|---|---|---|
| 5,763,941 A * | 6/1998 | Fjelstad | 257/669 |
| 6,133,634 A | 10/2000 | Joshi | |
| 6,355,502 B1 | 3/2002 | Kang et al. | |
| 6,469,384 B2 | 10/2002 | Joshi | |
| 6,624,522 B2 | 9/2003 | Standing | |
| 6,646,329 B2 | 11/2003 | Estacio et al. | |
| 6,653,740 B2 | 11/2003 | Kinzer et al. | |
| 6,767,820 B2 | 7/2004 | Standing et al. | |
| 6,777,800 B2 | 8/2004 | Madrid | |
| 6,803,647 B2 * | 10/2004 | Miyazaki | 257/669 |
| 7,285,849 B2 * | 10/2007 | Cruz et al. | 257/690 |
| 7,394,151 B2 | 7/2008 | Luo | |
| 7,511,361 B2 | 3/2009 | Zhang | |
| 7,589,400 B2 * | 9/2009 | Hozoji et al. | 257/E23.047 |
| 7,612,439 B2 | 11/2009 | Zhang | |
| 7,622,796 B2 | 11/2009 | Shi | |
| 7,683,464 B2 * | 3/2010 | Sun et al. | 257/666 |
| 7,776,658 B2 | 8/2010 | Liu | |
| 7,781,265 B2 | 8/2010 | Zhang | |
| 7,884,469 B2 | 2/2011 | Shi | |
| 7,897,438 B2 | 3/2011 | Luo | |
| 7,898,092 B2 | 3/2011 | Lu | |
| 7,906,375 B2 | 3/2011 | Liu | |
| 8,154,108 B2 * | 4/2012 | Liu et al. | 257/676 |
| 2003/0052405 A1 | 3/2003 | Moriguchi | |
| 2003/0067071 A1 | 4/2003 | Cardwell | |

(Continued)

FOREIGN PATENT DOCUMENTS

| WO | 2009070359 | 6/2009 |
|---|---|---|
| WO | 2009099834 | 8/2009 |

OTHER PUBLICATIONS

Tao Feng, U.S. Appl. No. 13/007,356, filed Jan. 14, 2011.

(Continued)

*Primary Examiner* — Matthew Landau
*Assistant Examiner* — Sun M Kim
(74) *Attorney, Agent, or Firm* — Joshua D. Isenberg; JDI Patent

(57) ABSTRACT

A clip for a semiconductor device package may include a metal sheet including an array of windows and one or more conductive fingers. Each of the conductive fingers has a first end and a second end. The first end is electrically connected to the metal sheet at one of the windows. Each of the conductive fingers is adapted to provide electrical connection to a top semiconductor region of a semiconductor device or a lead frame at the second end.

26 Claims, 5 Drawing Sheets

U.S. PATENT DOCUMENTS

| | | |
|---|---|---|
| 2003/0207546 A1 | 11/2003 | Wajima |
| 2006/0030169 A1* | 2/2006 | Noda et al. ............... 439/66 |
| 2006/0145312 A1 | 7/2006 | Liu |
| 2007/0057368 A1* | 3/2007 | Ho et al. ............... 257/735 |
| 2007/0123073 A1* | 5/2007 | Xiaochun ............... 439/92 |
| 2008/0036078 A1* | 2/2008 | Herbsommer et al. ....... 257/727 |
| 2008/0224282 A1* | 9/2008 | Ashida et al. ............... 257/669 |
| 2008/0274603 A1 | 11/2008 | Do et al. |
| 2009/0057869 A1 | 3/2009 | Hebert |
| 2009/0160045 A1 | 6/2009 | Sun |
| 2009/0194880 A1 | 8/2009 | Feng et al. |
| 2009/0218673 A1 | 9/2009 | Sun |
| 2009/0294934 A1* | 12/2009 | Shi et al. ............... 257/E23.043 |
| 2010/0133670 A1 | 6/2010 | Liu |
| 2011/0018116 A1 | 1/2011 | Feng |

OTHER PUBLICATIONS

Yueh-Se Ho, U.S. Appl. No. 12/846,743, filed Jul. 29, 2010.
Tao Feng, U.S. Appl. No. 12/916,086, filed on Oct. 29, 2010.

* cited by examiner

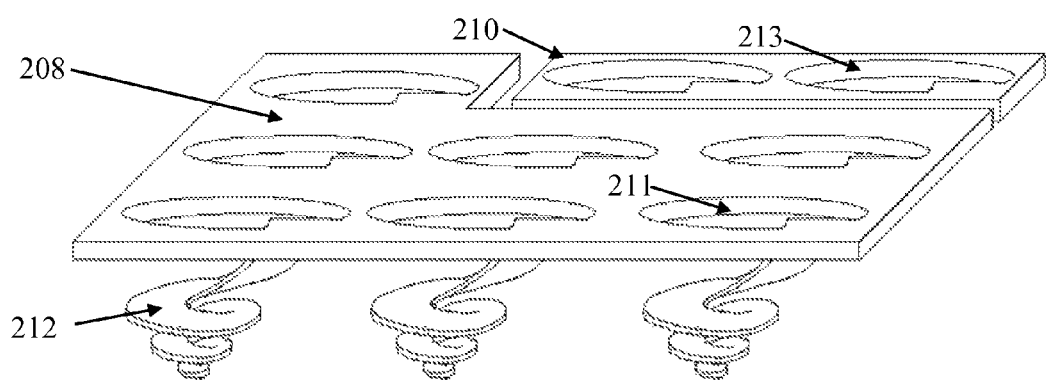
FIG. 2E
     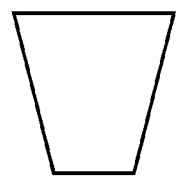     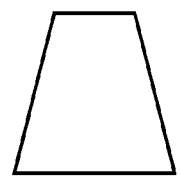     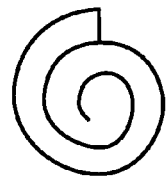
FIG. 3A     FIG. 3B     FIG. 3C     FIG. 3D

TOP EXPOSED CLIP WITH WINDOW ARRAY

FIELD OF THE INVENTION

This invention generally relates to semiconductor die packages and more particularly to the use of a source clip in a die package to provide electrical contact in a way that lowers spreading resistance and enhances heat dissipation.

BACKGROUND OF THE INVENTION

In semiconductor device packaging, a metallic clip is often used to provide electrical connections between a semiconductor die and a lead frame to which the die is mounted. Most current clips are non-exposed clips. Some clips may be exposed for better heat dissipation, but have limitations. For example, U.S. Pat. No. 6,624,522 discloses a metal oxide semiconductor (MOS) gated device wafer having a source side covered with a passivation layer, preferably a photosensitive liquid epoxy, or a silicon nitride layer, or the like. The wafer is coated by a spinning, screening, or otherwise depositing the liquid epoxy onto the wafer surface. The material is then dried and the coated wafer is exposed using standard photolithographic techniques to image the wafer and openings are formed in the passivation layer to produce a plurality of spaced exposed surface areas of the underlying source metal and a similar opening to expose the underlying gate electrode of each die on the wafer. The passivation layer acts as a passivation layer and can further act as a plating resist (if required) and as a solder mask, designating and shaping the solder areas.

The wafer is then sawn or otherwise singulated into individual die. The individual die are then placed source-side down and a U-shaped or cup shaped, partially plated drain clip is connected to the solderable drain side of the die, using a conductive epoxy or solder, or the like to bond the drain clip to the bottom drain electrode of the die. The bottoms of the legs of the drain clip are coplanar with the source-side surface (that is the tops of the contact projections) of the die. The outer surface of the die is then over molded in a mold tray. After molding, the devices are tested, laser marked and sawn into individual devices. However, the devices are not compatible with standard lead frame pinouts.

U.S. Pat. No. 6,777,800 discloses semiconductor die package including a vertical power MOSFET having a gate region and a source region positioned at a bottom surface and a drain region positioned at a top surface. A gate lead electrically coupled to the gate region and a source lead electrically coupled to the source region. A drain clip is electrically coupled to the drain region. A non-conductive molding material encapsulates the semiconductor die, wherein a surface of the drain clip is exposed through the non-conductive molding material. However, this semiconductor die package requires flip-chip process.

US Patent Application Publication 20080087992 discloses a semiconductor package having a bridged plate interconnection. The package utilizes a bridged source plate interconnection having a bridge portion, valley portions disposed on either side of the bridge portion, plane portions disposed on either side of the valley portions and the bridge portion, and a connection portion depending from one of the plane portions. The bridge portion is disposed in a plane above the plane of the valley portions while the plane portions are disposed in a plane intermediate the plane of the bridge portion and the plane of the valley portions. During encapsulation, bonding material flows under the bridge portion and provides mechanical strength to the bridged source plate interconnection. The top of the bridge portion may be exposed through the molding compound, however the exposed area is small, which only allows a small heat dissipation path.

U.S. patent application Ser. No. 12/130,663 discloses a top exposed bridge clip including two or more separate electrically conductive fingers electrically connected to each other by one or more electrically conductive bridges. A first end of at least finger is adapted for electrical contact with a lead frame. A semiconductor device package may include the clip along with a semiconductor device and a lead frame. The semiconductor device may have a first and semiconductor regions on top and bottom surfaces respectively. The clip may be electrically connected to the top semiconductor region at the bridges and electrically connected to the lead frame at a first end of at least one of the fingers. However, this clip has small exposed area, which only allows a small heat dissipation path.

It would be desirable to develop a semiconductor device package that allows efficient heat dissipation, and has low resistance connections to the semiconductor device. It would be further desirable to develop a package that is compatible with standard semiconductor pinouts. It would be further desirable to make a semiconductor device package that has a rugged stress release structure, and has the flexibility to be used with differently sized semiconductor devices.

It is within this context that embodiments of the present invention arise.

BRIEF DESCRIPTION OF THE DRAWINGS

Objects and advantages of the invention will become apparent upon reading the following detailed description and upon reference to the accompanying drawings in which:

FIG. 2E is a perspective view of a conductive clip according an alternative embodiment of the present invention.

FIGS. 3A-3D are top views depicting alternatives shapes of windows for a conductive clip according to an embodiment of the present invention.

Figure 1A:
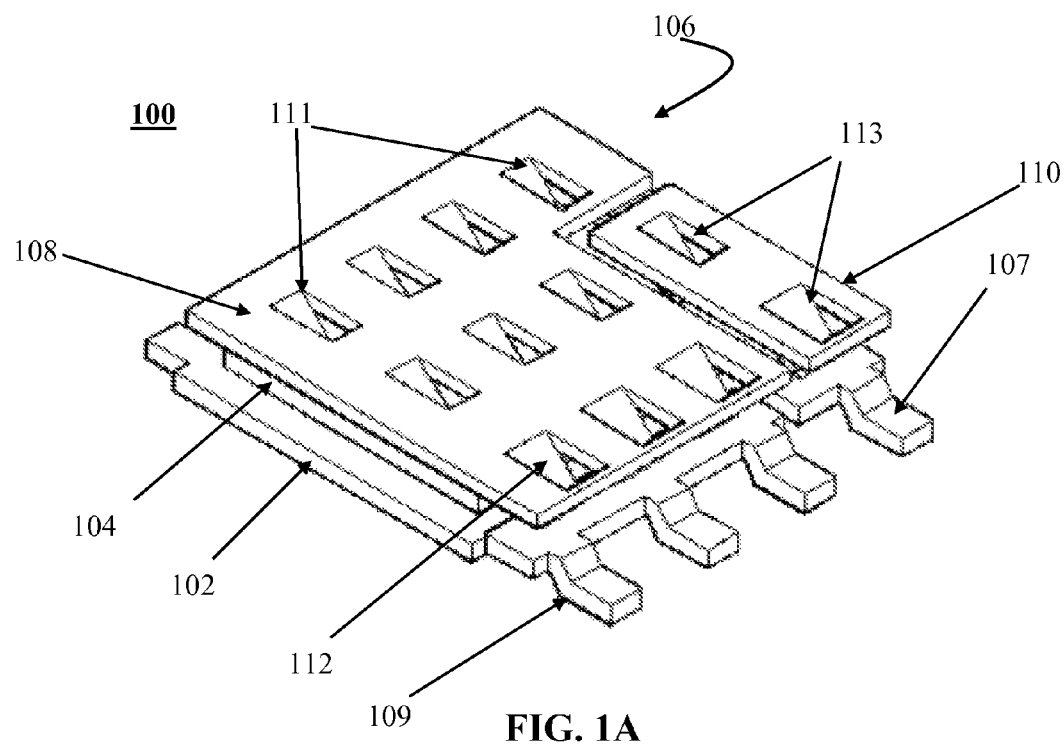
FIG. 1A is a perspective view of a semiconductor device package having a top exposed clip according to an embodiment of the present invention.

In these drawings, common features shown in the figures are indicated by common reference numerals.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

FIGS. 1A-1D depict a semiconductor device package 100 according to an embodiment of the present invention. In the example shown in FIGS. 1A and 1C, the device package 100 includes a fused lead frame 102 and a semiconductor device 104 having contact regions on top and bottom surfaces. The contact regions are formed from exposed regions of metal or other electrically conductive material that are in electrical contact with corresponding semiconductor device structures within the semiconductor device 104. By way of example, but not by way of limitation, the semiconductor device 104 may be a vertical metal oxide semiconductor (MOS) device having a top source contact S, a top gate contact G and a bottom drain contact D. In the example depicted in FIGS. 1A-1D, the semiconductor device 104 is located on top of the lead frame 102 with the bottom drain contact D facing and making electrical contact with the main portion of the lead frame 102. By way of example, and not by way of limitation, the lead frame 102 may be fused or non-fused.

According to an embodiment of the present invention, the semiconductor device package 100 includes single stage clips 106, which include two separate metal sheets 108 and 110 having arrays of windows 111 and 113 respectively. By way of example and not by way of limitation, the metal sheets 108 and 110 may be made of copper (Cu), steel, aluminum (Al), nickel, titanium (Ti), or alloys based on these metals, for example alloy 42-NiFe (42% Ni), or alloys of copper, steel, aluminum and Nickel and Ti, with other compositions. As used herein, metal refers to a material that is thermally and electrically conductive, and preferably is malleable. In metal sheet 108, arrays of conductive fingers 112, each of which includes a first end and a second end, are formed to make electrical contact with the source contact region S of the semiconductor device 104 at the second end of the conductive finger 112. The first end of each of the conductive fingers 112 is electrically connected to the metal sheet 108 at each of the corresponding windows 111. This configuration provides for multiple electrically parallel paths that are separated from each other. One or more additional conductive fingers 114 may be formed from a separate metal sheet 110 to provide electrical contact between the gate contact region G of the semiconductor device 104 and gate leads 107 of the lead frame 102. Each of the conductive fingers 114 includes a first end electrically connected to the metal sheet 110 at a window 113 and a second end formed to make electrical contact with the gate contact region G of the semiconductor device 104. Electrical and mechanical contact between the conductive fingers 112, 114 and contact regions S, G may be established, e.g., through the use of a solder or conductive adhesive 117.

By way of example and not by way of limitation, the second end of each conductive finger 112, 114 may be approximately in the shape of a "V" with the base of the "V" providing electrical contact to a source pad and a gate pad at the top of the device 104. The second end of conductive fingers 112 may have some other shape, e.g., "U" shape that provides electrical connections to the source. In this text "V" shape will describe a general inverted-arch shape, which includes but is not limited to "U" shape and other equivalents. The clip may include conductive fingers 115 and 116 formed proximate edges of the metal sheets 108, 110 to make electrical contact with a fused source lead 109 and a gate lead 107 respectively of the lead frame 102, which reduces displacement during clip bonding. Electrical and mechanical contact between the conductive fingers 115, 116 and leads 109, 107 may be established, e.g., through the use of a solder or conductive adhesive 117. The second ends of conductive fingers 115 and 116 may have a sharper contact with the lead frame 102 than the conductive fingers 112 and 114 have with semiconductor die 104 in order to reduce unwanted displacement during clip bonding.

The conductive fingers can be made by a single step or two step punch process. The conductive fingers can be made from the same sheet of metal from which the windows are formed. In this embodiment, arrays of conductive fingers 112, 115 may be punched from the metal sheet 108 forming windows 111, and conductive fingers 114 and 116 are punched from the metal sheet 110 forming windows 113.

By way of example, and not by way of limitation, the semiconductor device 104 may be a metal-oxide semiconductor (MOS) device having a top source and gate and a bottom drain. In such an example, the metal sheets 108 and 110 of clips 106 is sometimes referred to as a "source clip" and a "gate clip", respectively. The clip 106 may be electrically connected to the top source of the device 104 only at the fingers 112. The base of each "V" may be flattened to facilitate electrical connection between the fingers 112 and the top source of the device 104. The source clip 108 of this invention may be used independently of the gate clip 110. In an alternative embodiment the gate clip 110 may be replaced by a standard bond wire or a standard clip. By way of example, and not by way of limitation, clips like 106 may also be used with other types of semiconductor devices, especially vertical semiconductor devices such as bipolar junction transistors (BJT), insulated gate bipolar transistor (IGBT), and diodes.

Figure 1B:
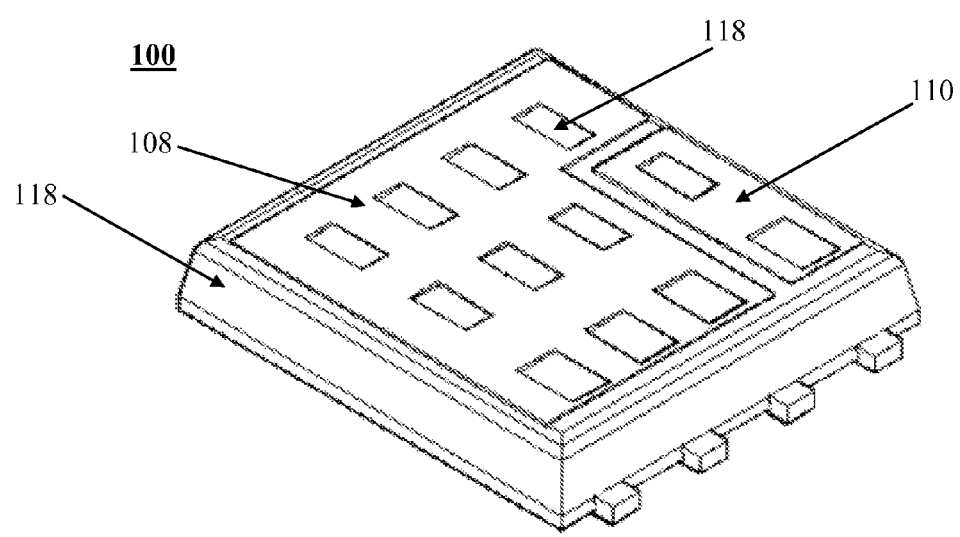
FIG. 1B is a perspective view of the device package of FIG. 1A encapsulated with molding compound.
Figure 1C:
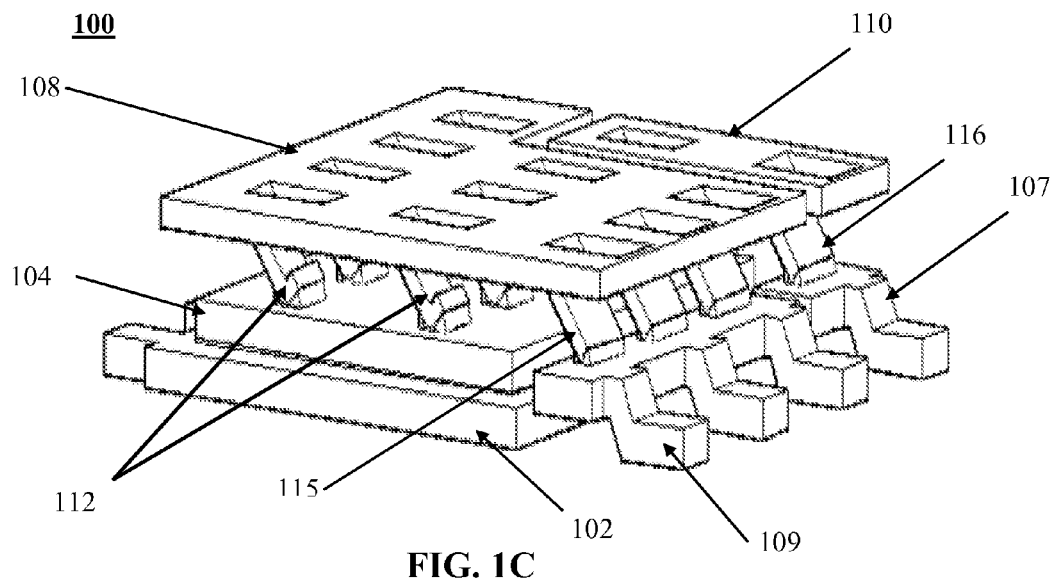
FIG. 1C is a perspective view of the device package of FIG. 1A.

As shown in FIG. 1B, the semiconductor device package 100 may be encapsulated with molding compound 118 and leave the tops of the metal sheets 108, 110 exposed. The exposed area is large and allows for efficient heat dissipation. By way of example, and not by way of limitation, the molding compound 118 may be an epoxy.

Figure 1D:
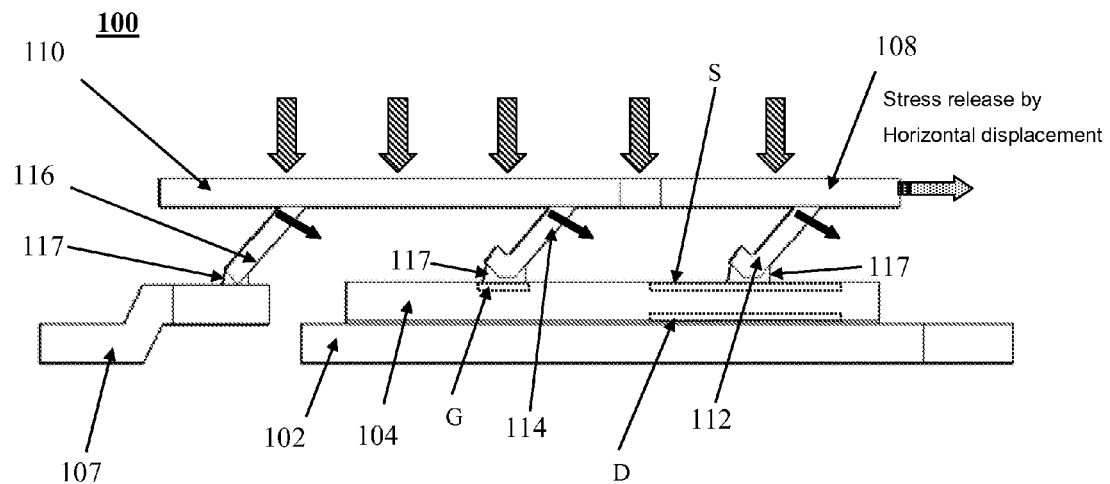
FIG. 1D is a side elevation view of the device package of FIG. 1A.

Thermal expansion mismatch between silicon and metal may cause stress or even cracking. This problem may be worse if there is a large single area of contact between the two. A solution can be used to break the contact area into several smaller pieces, as is done in the semiconductor device 100. The clip 106 provides a stress release structure between the clip 106 and the MOS device 104 through the multiple contact points provided by the conductive fingers 112, 114, 115 and 116. The conductive fingers 112, 114, 115 and 116 may also add mechanical strength to the package, as it gives the molding compound 118 more features to anchor and at different angles. As shown in FIG. 1D, when under a vertical force, stress may be released by horizontal displacement.

In the clip 106, multiple electrical contact areas reduce the spreading resistance. Spreading resistance refers to an electrical resistance resulting from spreading of electrical current in a conductor as it flows laterally from a point of contact with the conductor. Spreading resistance may be reduced by distributing multiple parallel conductive paths to channel electric current throughout the contact pad at the top of the semiconductor device 104. A clip of the type shown in FIGS. 1A-1D can have a lower electrical resistance than if the contact points were bunched closely together or if the contact points were fewer in number, as in the source clip configuration shown in US Patent Application Publication 20080087992.

Another advantage of this invention is that it is compatible with standard semiconductor package pinouts and footprints. Thus this invention can be used in existing assemblies, without having to change the design of the circuit board or surrounding parts.

The semiconductor device package 100 can be easily assembled by one skilled in the art. For example, the semiconductor device 104 may be mounted on lead frame 102. The clips 106 may then be attached to the semiconductor device 104 and to the lead frame 102. A molding compound 118 may be added to encapsulate most of semiconductor device package 100. The tops of the clips 106 are exposed through the molding compound 118 to facilitate heat dissipation.

FIGS. 2A-2D illustrate a semiconductor device package 200 according to a preferred embodiment of the present invention. The semiconductor device package 200 basically includes all the components of the semiconductor device package 100 described above and depicted in FIGS. 1A-1D, except that the source clip includes dual stage fingers to accommodate a thicker package.

Figure 2A:
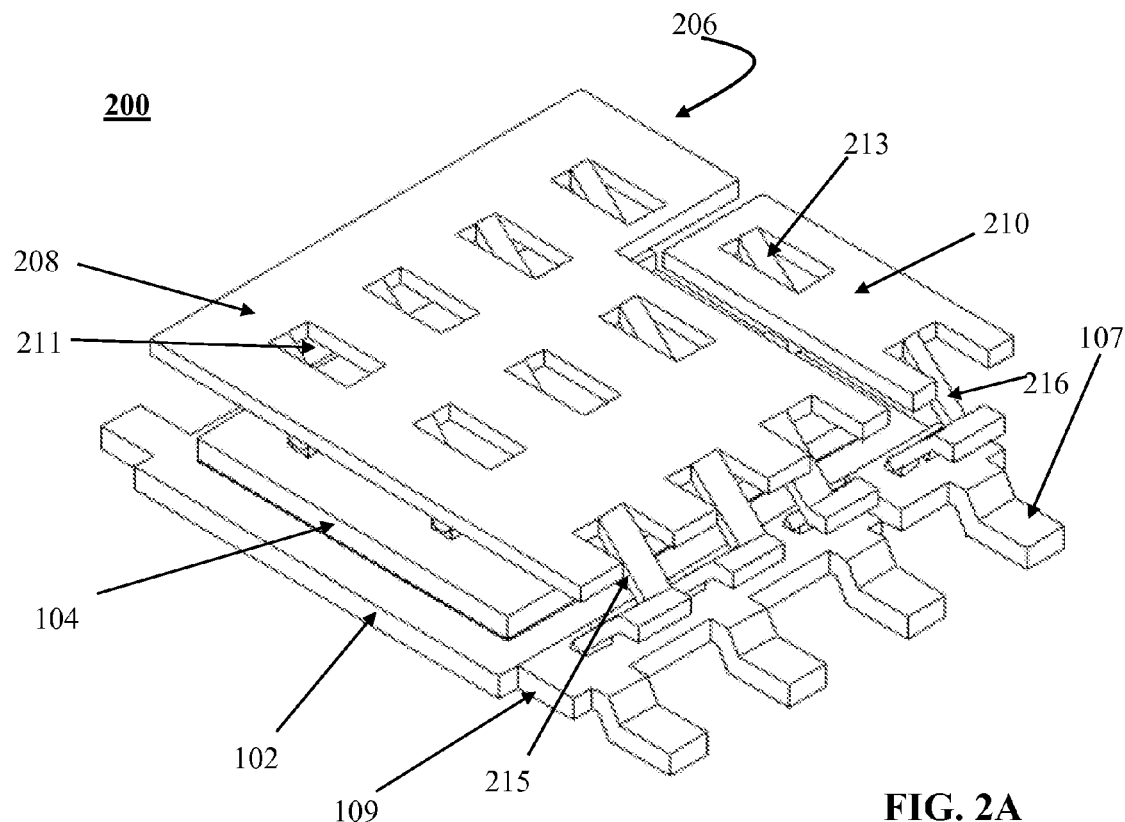
FIG. 2A is a perspective view of a semiconductor device package having a top exposed clip according to another embodiment of the present invention.
Figure 2B:
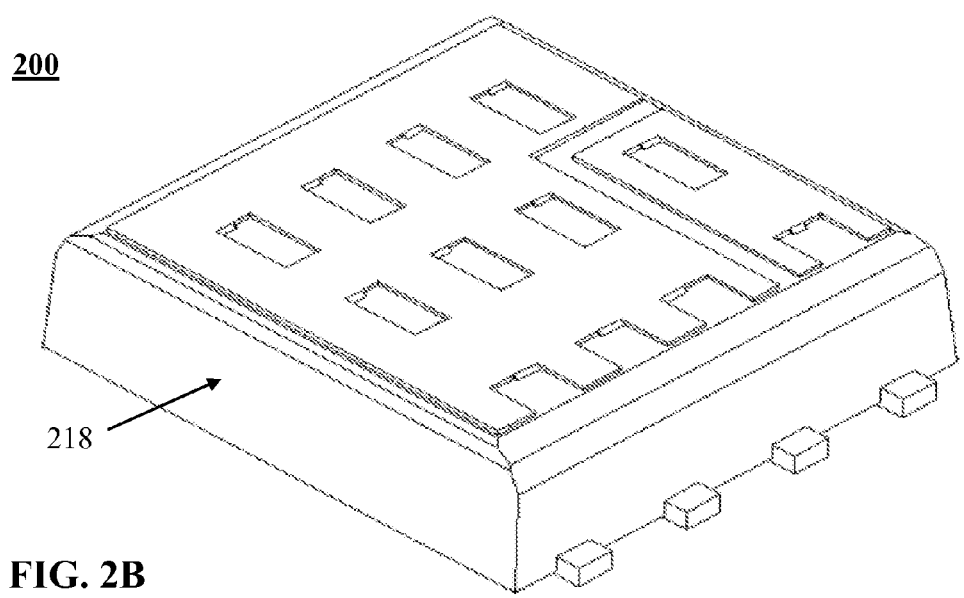
FIG. 2B is a perspective view of the device package of FIG. 2A encapsulated with molding compound.
Figure 2C:
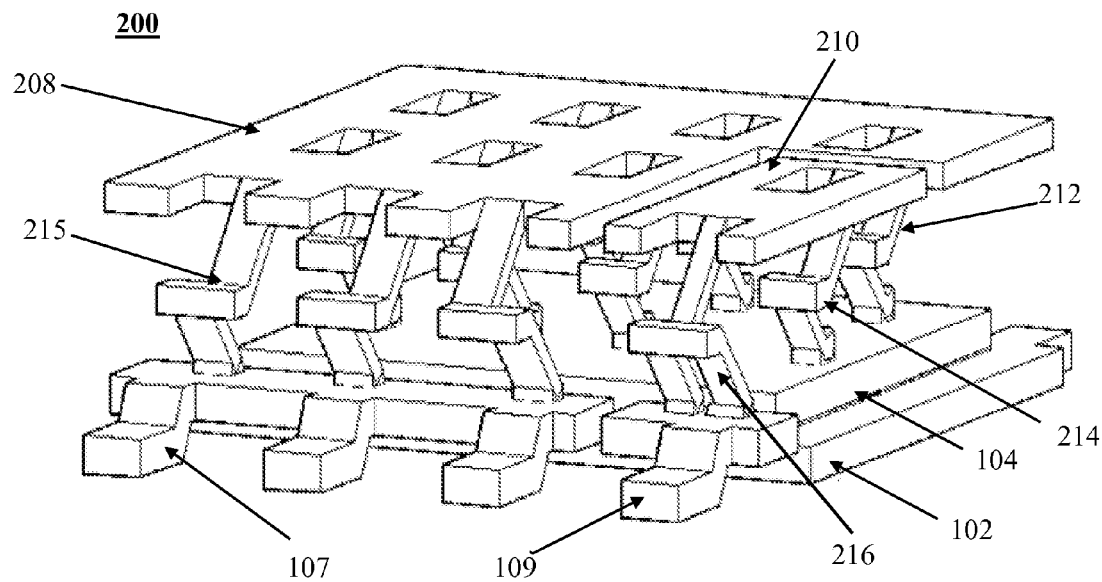
FIG. 2C is a perspective view of the device package of FIG. 2A.

As shown in FIGS. 2A and 2C, the device package 200 includes a fused lead frame 102 and a semiconductor device 104, e.g., a MOS device having a top source S, a top gate G and a bottom drain D located on top of the lead frame 102 with the bottom drain D contacting the main portion of the lead frame 102. By way of example, and not by way of limitation, the lead frame 102 may be fused or non-fused.

According to an embodiment of the present invention, the semiconductor device package 200 includes clips 206, which includes two separate metal sheets 208 and 210 having arrays of windows 211 and 213 respectively. On metal sheet 208, arrays of conductive fingers 212, each of which has a first end and a second end, are formed to make electrical contact with a top source of the semiconductor device 104 at the second end. The first end of each of the conductive fingers 212 is electrically connected to the metal sheet 208 at each of the corresponding widows 211. This configuration provides for multiple electrically parallel paths that are separated from each other. On metal sheet 210 the conductive finger 214, including a first end and a second end, is formed to make electrical contact with a top gate of the semiconductor device 104 at the second end. The first end of each of the conductive fingers 214 is electrically connected to the metal sheet 210 at the corresponding windows 213. By way of example and not by way of limitation, the second ends of the conductive fingers 212 and 214 may be approximately in the shape of a "V" with the base of the "V" providing electrical contact to a source pad and a gate pad at the top of the device 104. The conductive fingers 212, 214 may have some other shape, e.g., "U" shape that provides electrical connections to the source. In this text "V" shape will describe a general inverted-arch shape, which includes but is not limited to "U" shape and other equivalent shapes.

The conductive fingers 215 and 216 are formed on the metal sheets 208 and 210 respectively to make sharp electrical contact with a fused source lead 109 and a gate lead 107 respectively of the lead frame 102, which reduces displacement while clip bonding.

The conductive fingers can be made by single step or two step punch process. The conductive fingers can be made from the same sheet of metal as the windows, e.g., metal sheets 208 and 210. In this embodiment, arrays of conductive fingers 212, 215 may be punched from the metal sheet 208 forming windows 211, and conductive fingers 214 and 216 may be punched from the metal sheet 210 forming windows 213.

Figure 2D:
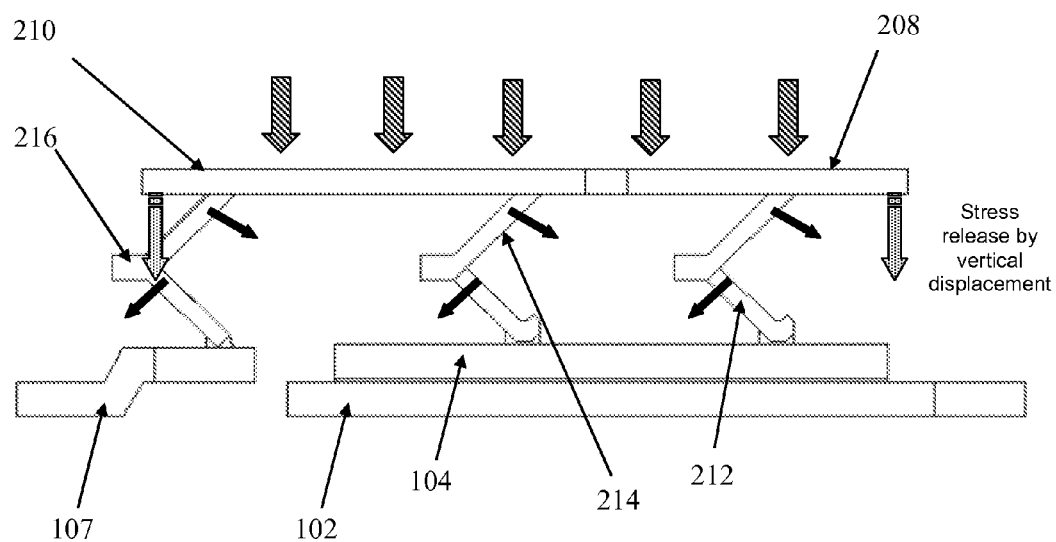
FIG. 2D is a side elevation view of the device package of FIG. 2A.

Preferably, the shape of the conductive fingers 212, 214, 215 and 216 takes into consideration the distance from the metal sheet 208 to the semiconductor device 104 surface. In this embodiment, as shown in FIGS. 2C and 2D, the conductive fingers 212, 214, 215 and 216 are dual stage, e.g., stair shape, which provides more stress release capability, less horizontal movement while stress release and higher distance from package top surface to die surface. In this case, the stress releases by vertical displacement. In an alternative embodiment, the conductive fingers 212 may be spiral shaped, e.g., as depicted in FIG. 2E. To form the spiral shape, the spiral pattern may first be cut on the metal sheet 208, and then punched out.

As shown in FIG. 2B, the semiconductor device package 200 may be encapsulated with molding compound 218 and leave the tops of the metal sheets 208 and 210. By way of example, and not by way of limitation, the molding compound 218 may be an epoxy.

As shown in FIG. 2D, when under a vertical force, stress may be released by a vertical displacement.

The clips 106 and 206 are approximately the same size as the semiconductor device package. Typical size of the clips 106 and 206 is from about sub-millimeter to a few centimeters. For example, the size of the clip could be from about 0.5 mm to about 5 cm in length and width. The length and width may be different from each other.

By way of example, and not by way of limitation, FIGS. 3A-3C are top views of alternative shapes of the windows 111, 113 and 211, 213 as described in FIGS. 1A-1D and 2A-2D respectively. The corresponding conductive fingers may have corresponding shapes. FIG. 3D shows a top view of the pattern of the spiral shaped conductive finger embodiment of FIG. 2E.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A clip for a semiconductor device package, comprising:
   a metal sheet including an array of windows;
   one or more conductive fingers, each of the conductive fingers having a first end and a free second end, wherein the first end is electrically connected to the metal sheet at one of the windows and the free second end is not connected to the metal sheet;
   wherein the free second end is configured to allow horizontal displacement of the metal sheet such that stress produced from a force acting in the vertical direction is relieved; and
   wherein each of the conductive fingers is adapted to provide electrical connection to a top semiconductor region of a semiconductor device or a lead frame at the second end.

2. The clip of claim 1, wherein the conductive fingers are single stage.

3. The clip of claim 1, wherein the conductive fingers are dual stage.

4. The clip of claim 1, wherein the conductive fingers are spiral shaped.

5. The clip of claim 1, wherein the one or more conductive fingers include one or more fingers for which the second ends are approximately "V" shaped, wherein a base of each "V" shape is adapted to make an electrical connection to the top semiconductor region.

6. The clip of claim 1, wherein the one or more conductive fingers further include one or more fingers for which the second is adapted to make an electrical connection to a lead frame.

7. The clip of claim 1, wherein the metal sheet comprises a material selected from the group consisting of copper, steel, aluminum, Nickel, Ti, Mo, or alloys of copper, steel, aluminum and Nickel and Ti and Mo, with other compositions.

8. The clip of claim 1, wherein the conductive fingers are configured to provide multiple electrically parallel paths that are separated from each other by gaps between adjacent windows.

9. The clip of claim 1, wherein a size of the clip is between about 0.5 mm and about 5 cm.

10. The clip of claim 1, wherein the conductive fingers are punched from the metal sheet.

11. A semiconductor device package comprising:
 a lead frame comprising a main part and one or more leads;
 a semiconductor device comprising at least a first contact region on a top surface; and
 a clip comprising:
  a metal sheet including an array of windows;
  a plurality of conductive fingers, each of the conductive fingers including a first end and a free second end, wherein the first end is electrically connected to the metal sheet at one of the windows and the free second end is not connected to the metal sheet;
 wherein the clip is electrically connected to the first contact region of the semiconductor device at the second ends of a first subset of the plurality of conductive fingers;
 wherein the free second end is configured to allow horizontal displacement of the metal sheet such that stress produced from a force acting in the vertical direction is relieved;
 wherein the clip electrically connects the first contact region to the lead frame; and
 wherein the bottom surface of the semiconductor device is located facing the main part of the lead frame.

12. The semiconductor device package of claim 11, wherein the second end of the first subset of the plurality of conductive fingers is approximately "V" shape, wherein the base of each "V" shape is adapted to make an electrical connection to the first contact region.

13. The semiconductor device package of claim 11, wherein the clip is electrically connected to the lead frame at the second ends of a second subset of the plurality of conductive fingers.

14. The clip of claim 11, wherein the conductive fingers are single stage.

15. The clip of claim 11, wherein the conductive fingers are dual stage.

16. The clip of claim 11, wherein the conductive fingers are spiral shaped.

17. The semiconductor device package of claim 11, wherein the semiconductor device is encapsulated with a molding compound, wherein the top surface of the clip is exposed through the molding compound.

18. The semiconductor device package of claim 11 wherein the semiconductor device is a metal oxide semiconductor (MOS) device;

wherein the MOS device further comprises a gate region on the top surface thereof.

19. The semiconductor device package of claim 18, further comprising a gate clip comprising:
 a second metal sheet including an array of windows;
 one or more conductive gate fingers, each of the gate fingers including a first end and a second end, wherein the first end is electrically connected to the second metal sheet at one of the windows;
wherein the gate clip is electrically connected to a gate contact region of the semiconductor device at the second ends of at least one of the gate fingers;
wherein the gate clip is electrically connected to a gate lead at the second end at least another of the gate fingers.

20. The semiconductor device package of claim 11, wherein the clip is configured to be used with semiconductor devices of a standard size.

21. The semiconductor device package of claim 11, wherein the clip provides multiple parallel electrical and thermal paths throughout the first region of the semiconductor device.

22. The semiconductor device package of claim 11, wherein the semiconductor device is a vertical semiconductor device, wherein semiconductor device further comprises a second contact region on the bottom surface which is conductively attached to the main part of the lead frame.

23. A method of forming a semiconductor device package comprising:
 (a) attaching a semiconductor device having a first contact region on a top side thereof and to a lead frame such that a bottom side of the semiconductor device rests on a main part of the lead frame;
 (b) attaching a clip to the semiconductor device and the lead frame, wherein the clip comprises:
  a metal sheet including array of windows;
  a plurality of conductive fingers, each of the conductive fingers including a first end and a free second end, wherein the first end is electrically connected to the metal sheet at one of the windows and the free second end is not connected to the metal sheet, wherein the free second end is configured to allow horizontal displacement of the metal sheet such that stress produced from a force acting in the vertical direction is relieved;
 wherein the clip is electrically connected to the first contact region of the semiconductor device at the second ends of the conductive fingers; and
 (c) encapsulating the semiconductor device and portions of the lead frame, and clip with a molding compound such that the top surface of the clip is exposed through the molding compound.

24. The method of claim 23 wherein the semiconductor device is a vertical metal-oxide semiconductor field effect transistor (MOSFET) wherein the MOSFET further comprises a gate contact region on a top side thereof; and
wherein the method further comprises between (a) and (c):
 (d) connecting the gate contact region of the MOSFET to a gate lead of the lead frame.

25. The method of claim 23, wherein the conductive fingers are formed by punching them from the metal sheet.

26. The method of claim 23, wherein the semiconductor device is a vertical semiconductor device, and (b) further comprises conductively attaching the bottom of the vertical semiconductor device to the main part of the lead frame.

* * * * *